United States Patent
Zhang

(10) Patent No.: US 11,647,660 B2
(45) Date of Patent: May 9, 2023

(54) COLOR FILTER SUBSTRATE AND FABRICATING METHOD THEREOF

(71) Applicant: Shenzhen China Star Optoelectronics Semiconductor Display Technology Co., Ltd., Shenzhen (CN)

(72) Inventor: Liangfen Zhang, Shenzhen (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 461 days.

(21) Appl. No.: 16/627,357

(22) PCT Filed: Nov. 28, 2019

(86) PCT No.: PCT/CN2019/121430
§ 371 (c)(1),
(2) Date: Dec. 30, 2019

(87) PCT Pub. No.: WO2021/093028
PCT Pub. Date: May 20, 2021

(65) Prior Publication Data
US 2021/0359008 A1  Nov. 18, 2021

(30) Foreign Application Priority Data
Nov. 15, 2019 (CN) .......................... 201911118797.4

(51) Int. Cl.
*H01L 27/32* (2006.01)
*G02B 5/20* (2006.01)
(Continued)

(52) U.S. Cl.
CPC ............ *H01L 27/322* (2013.01); *G02B 5/201* (2013.01); *H01L 51/5284* (2013.01); *H01L 51/56* (2013.01)

(58) Field of Classification Search
CPC ... H01L 27/322; H01L 51/5284; H01L 51/56; H01L 27/3211; H01L 2227/323; G02B 5/201
See application file for complete search history.

(56) References Cited

U.S. PATENT DOCUMENTS 9,201,182 B2  12/2015  Wang et al.
9,753,194 B2   9/2017  Lee et al.
(Continued)

FOREIGN PATENT DOCUMENTS

CN  102798916  11/2012
CN  107845668   3/2018
(Continued)

*Primary Examiner* — Kevin Quarterman
(74) *Attorney, Agent, or Firm* — PV IP PC; Wei Te Chung; Ude Lu

(57) ABSTRACT

A color filter substrate and a fabricating method thereof are provided. The color filter substrate has a pixel definition layer having a first pixel-defining structure and a second pixel-defining structure, and the second pixel-defining structure encapsulates the first pixel-defining structure. The pixel definition layer enhances its structural support strength while ensuring its own shading property and hydrophobicity, so that it can reach a target height, and an undercut phenomenon is less likely to occur.

9 Claims, 3 Drawing Sheets

(51) Int. Cl.
    *H01L 51/52*     (2006.01)
    *H01L 51/56*     (2006.01)

(56) References Cited

U.S. PATENT DOCUMENTS

| | | | |
|---|---|---|---|
| 9,859,342 B2 * | 1/2018 | Kim | H01L 51/5262 |
| 2019/0148459 A1 | 5/2019 | He et al. | |
| 2019/0386253 A1 * | 12/2019 | Li | H01L 51/5284 |
| 2020/0089047 A1 * | 3/2020 | Baek | G02F 1/133516 |
| 2020/0252707 A1 * | 8/2020 | Won | H01L 51/56 |
| 2021/0200011 A1 * | 7/2021 | Zhang | H01L 27/3246 |

FOREIGN PATENT DOCUMENTS

| | | |
|---|---|---|
| CN | 109065569 | 12/2018 |
| CN | 110098220 | 8/2019 |

* cited by examiner

COLOR FILTER SUBSTRATE AND FABRICATING METHOD THEREOF

FIELD OF INVENTION

The invention relates to the field of display, in particular to a color filter substrate and a fabricating method thereof.

BACKGROUND OF INVENTION

Organic light-emitting diode (OLED) display devices have many advantages such as self-luminous, low driving voltage, high luminous efficiency, fast response times, high definition and contrast ratio, nearly 180° viewing angles, wide temperature range, flexible display, and large-area full-color display, and are recognized by the industry as the next generation of flat panel display emerging application technology.

At present, quantum dot (QD) material itself has excellent properties of high color purity and continuous spectral adjustments, making it the most excellent luminescent material in the 21st century, which can greatly improve color gamut in conventional liquid crystal displays. Thus, its display applications have been extensively studied in recent years. OLED, also known as organic electroluminescent device, has the characteristics of self-luminous, ultra-thin, fast response times, wide viewing angles, etc. Blue OLED devices (BOLED) are ideal quantum dot excitation sources. Therefore, panels produced by the combination of quantum dots and blue OLED devices (QD-BOLED) have advantages of both quantum dots and OLEDs, thereby improving product performance.

For an OLED display device that uses a blue organic light-emitting layer and a light-color conversion layer to realize full-color display, the design of a color filter substrate thereof needs to add a quantum dot light-conversion layer between a pixel definition layer. However, the pixel definition layer fabricated in the conventional art is a single layer structure, cannot meet a height required for inkjet printing, and is prone to undercut, affecting the fabrication of the quantum dot light-conversion layer, and affecting blue light-conversion of the OLEDs.

SUMMARY OF INVENTION

The object of the present invention is to provide a color filter substrate and a fabricating method thereof for solving the undercut phenomenon occurring in a pixel definition layer in the conventional art, improving the stability of a quantum dot light-conversion layer, and improving the efficiency of blue light-conversion.

To achieve the above object, the present invention provides a color filter substrate including a pixel definition layer. The pixel definition layer including a first pixel-defining structure and a second pixel-defining structure, wherein the second pixel-defining structure encapsulates the first pixel-defining structure.

Further, the color filter substrate further including a substrate; a black matrix disposed on the substrate, wherein a plurality of first openings are provided on the black matrix; a color pixel layer disposed on the substrate in the plurality of first openings; and a transparent protective layer covering the color pixel layer and the black matrix; wherein the pixel definition layer is disposed on a surface of the transparent protective layer away from the color pixel layer, and the pixel definition layer corresponds to the black matrix.

Further, the color pixel layer includes a plurality of red sub-pixels, green sub-pixels, and blue sub-pixels, and the red sub-pixels, the green sub-pixels, and the blue sub-pixels are all evenly distributed on the substrate and filled in the first openings.

Further, a plurality of second openings are disposed in the pixel definition layer, the second openings are positioned corresponding to the first openings, and the color filter substrate further includes a quantum dot light-conversion layer disposed on the transparent protective layer in the second openings.

Further, the quantum dot light-conversion layer is provided in the second openings corresponding to the red sub-pixels and the green sub-pixels.

Further, a material used for the first pixel-defining structure includes one or more of silicon oxide, silicon nitride, and an organic material, and a material used for the second pixel-defining structure is a light-shielding hydrophobic material.

Further, a cross-sectional shape of the pixel definition layer and a cross-sectional shape of the first pixel-defining structure are both trapezoidal.

Further, a height of the pixel definition layer is greater than 6 um.

The present invention further provides a method of fabricating a color filter substrate, including steps of: providing a substrate; forming a first pixel-defining structure on the substrate; and forming a second pixel-defining structure on the first pixel-defining structure.

Further, after providing the substrate, the method further includes following steps: forming a black matrix on the substrate; forming a color pixel layer on the substrate; and forming a transparent protective layer on the black matrix and the color pixel layer; and wherein after forming the second pixel-defining structure, the method further includes a step of forming a quantum dot light-conversion layer on the transparent protective layer.

The present invention has the advantages that in the color filter substrate of the present invention, the pixel definition layer in the color filter substrate has a double-layer structure, which enhances the structural support strength while ensuring its own shading property and hydrophobicity. It can reach the target height, and is not prone to the occurrence of undercut phenomenon, improving the stability of the quantum dot light-conversion layer and thereby improving the yield of the products. Moreover, the fabricating method is simple, and the fabricating materials can also be purchased on the market.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
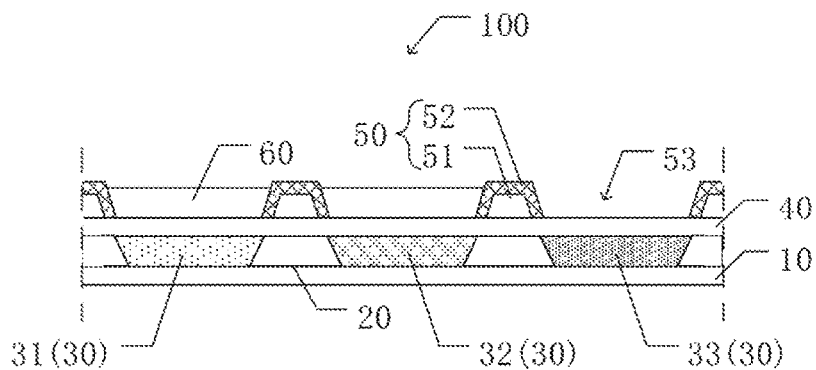
FIG. 1 is a schematic view showing a layered structure of a color filter substrate according to an embodiment of the present invention.

The component reference numbers in the figures are as follows:

color filter substrate 100; substrate 10; black matrix 20; first openings 21; color pixel layer 30; red sub-pixels 31; green sub-pixels 32; blue sub-pixels 33; transparent protective layer 40; pixel definition layer 50; first pixel-defining structure 51; second pixel-defining structure 52; second openings 53; quantum dot light-conversion layer 60.

DETAILED DESCRIPTION OF EMBODIMENTS

The preferred embodiments of the present invention will be described with reference to the accompanying drawings, which are to be construed as illustrative embodiments of the invention. The present invention can be embodied in many different forms of the embodiments of the invention, and the scope of the invention is not limited to the embodiments described herein.

In the drawings, structurally identical components are denoted by the same reference numerals, and structural or functionally similar components are denoted by like reference numerals. The dimensions and thickness of each component shown in the drawings are arbitrarily shown, and the invention does not limit the size and thickness of each component. In order to make the illustration clearer, some portions of the drawing appropriately exaggerate the thickness of the components.

In addition, the following description of the various embodiments of the invention is intended to be illustrative of the specific embodiments of the invention. Directional terms mentioned in the present invention, for example, "upper", "lower", "front", "back", "left", "right", "inside", "outside", "side", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention.

In addition, unless otherwise defined, any technical or scientific term used herein shall have the common meaning understood by a person of ordinary skills. Such words as "first", "second", and "third" used in the specification and claims are merely used to differentiate different components rather than to represent any order, number or importance. In the description of the present invention, the meaning of "plurality" is two or more unless specifically defined otherwise.

When a component is described as "on" another component, the component can be placed directly on the another component, and an intermediate part can also be placed therebetween, that is, the component being placed on the intermediate part, and the intermediate part is placed on the another component. When the component is described as "mounted to" or "connected to" the another component, it can be understood as directly "mounted" or "connected", or a component is "mounted to" or "connected to" the another component through the intermediate part.

In an embodiment of the present invention, a color filter substrate 100 is provided. As shown in FIG. 1, the color filter substrate 100 includes a substrate 10, a black matrix 20, a color pixel layer 30, a transparent protective layer 40, and a pixel definition layer 50.

The substrate 10 is a glass substrate. The black matrix 20 is disposed on the substrate 10, a plurality of first openings 21 are provided in the black matrix 20, and the color pixel layer 30 is disposed in the first openings 21.

The color pixel layer 30 includes a plurality of red sub-pixels 31, a plurality of green sub-pixels 32, and a plurality of blue sub-pixels 33. The red sub-pixels 31, the green sub-pixels 32, and the blue sub-pixels 33 are sequentially filled in the first openings 21. The black matrix 20 is generally a black light-shielding material. The function of the black matrix 20 is to block the scattered light, so that the light passes only the color pixel layer 30, to prevent color mixing between primary colors, and prevent ambient light from being irradiated onto a channel of thin film transistor to affect the display effect. The color pixel layer 30 has color resist materials therein. When the light passes through occlusion of the black matrix 20 and passes through the color pixel layer 30, the light is filtered by the color resist materials in the red sub-pixels 31, the green sub-pixels 32, and the blue sub-pixels 33, respectively, thereby filtering out only the specific red light, green light, and blue light that are displayed to realize the display of the color screen.

The transparent protective layer 40 covers the black matrix 20 and a surface of the color pixel layer 30 away from the substrate 10. The transparent protective layer 40 is generally an inorganic material such as transparent silicon oxide, which is used for isolating and protecting the color pixel layer 30 and the black matrix 20, preventing intrusion of water and oxygen, denaturation of internal materials, and preventing display images from being poor or the occurrence of phenomena such as peeling off, and the stability of the color filter substrate 100 is improved. Since it is transparent, it does not affect the light transmission.

The pixel definition layer 50 is disposed on a surface of the transparent protective layer 40 away from the black matrix 20 and the color pixel layer 30, and corresponds to the black matrix 20. A plurality of second openings 53 are provided in the pixel definition layer 50, and the second openings 53 correspond to the first openings 21. A quantum dot light-conversion layer 60 is provided in the second openings 53 corresponding to the red sub-pixels 31 and in the second openings 53 corresponding to the green sub-pixels 32. The quantum dot light-conversion layer 60 corresponding to the red sub-pixels 31 has a red quantum dot material, and the quantum dot light-conversion layer 60 corresponding to the green sub-pixels 32 has a green quantum dot material. When the light of a blue backlight passes through the quantum dot light-conversion layer 60, the red quantum dot material or the green quantum dot material in the quantum dot light conversion layer 60 emits red light and green light, respectively, under blue light excitation. The red light and the green light then pass through the corresponding red sub-pixels 31 and green sub-pixels 32 to emit red and green light with better color. Moreover, the second openings 53 corresponding to the blue sub-pixels 33 are not filled with any material, and the light of the blue backlight directly passes the second openings 53 into the corresponding blue sub-pixels 33 to filter out the blue light with higher color, thereby improving the color gamut of the display screen to improve user experience.

In the pixel definition layer 50, which has a first pixel-defining structure 51 and a second pixel-defining structure 52, and the second pixel-defining structure 52 encapsulates the first pixel-defining structure 51. Meanwhile, a cross-sectional shape of the first pixel-defining structure 51 and a cross-sectional shape of the pixel definition layer 50 are both trapezoidal, and a height of the pixel definition layer 50 is greater than 6 um. A material used for the first pixel-defining structure 51 includes one or more of silicon oxide, silicon nitride, and an organic material, and a material used for the second pixel-defining structure is a light-shielding hydrophobic material.

Figure 2:
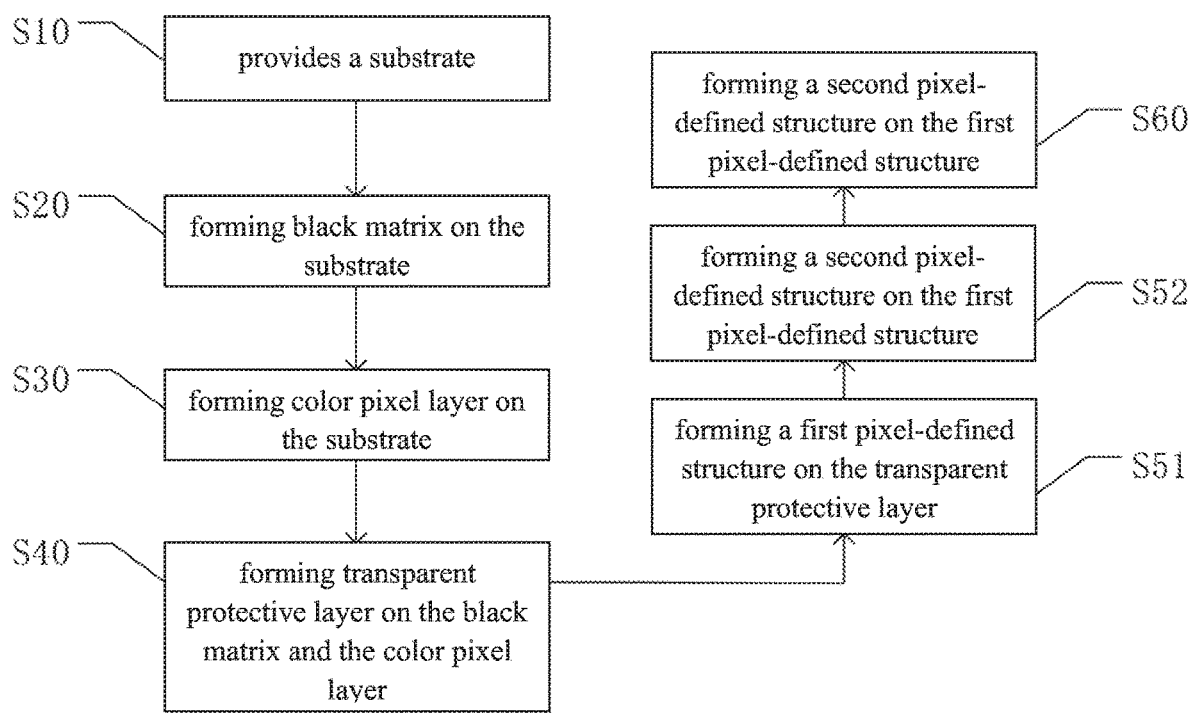
FIG. 2 is a flowchart showing a fabricating method according to an embodiment of the present invention.

In the embodiment of the present invention, a method of fabricating the color filter substrate 100 is further provided. The fabricating process is shown as FIG. 2, and includes the following specific fabricating steps.

Step S10, providing a substrate 10, the substrate 10 can be a transparent inorganic substrate 10 such as a glass substrate.

Figure 3:
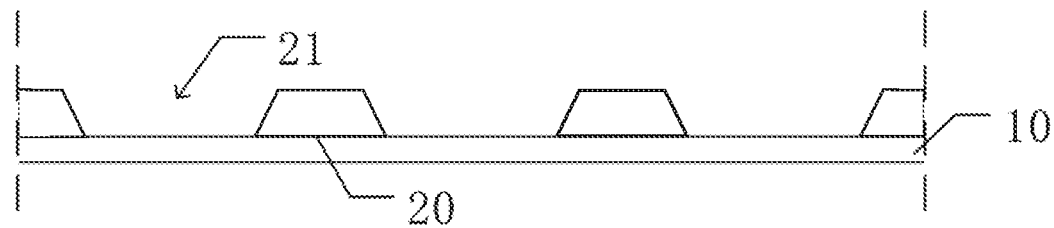
FIG. 3 is a schematic view showing a layered structure in step S20 according to an embodiment of the present invention.

Step S20, forming a black matrix 20 on the substrate 10, as shown in FIG. 3, depositing a black light-shielding material layer on the black matrix 20, and patterning the black light-shielding material layer by photolithography or the like. A plurality of first openings 21 are etched into the black light-shielding material layer to form the black matrix 20.

Figure 4:
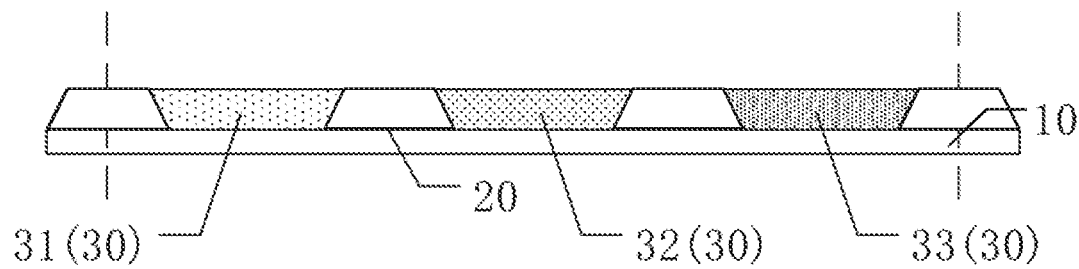
FIG. 4 is a schematic view showing a layered structure in step S30 according to an embodiment of the present invention.

Step S30, forming a color pixel layer 30 on the substrate 10, as shown in FIG. 4, depositing a layer of red color resist material on the substrate 10 in the first openings 21, and patterning the layer of red color resist material by etching to form the red sub-pixels 31. The green sub-pixels 32 and the blue sub-pixels 33 are respectively fabricated by same fabricating method as the red sub-pixels 31 by using green color resist material and blue color resist material, and finally the color pixel layer 30 is formed.

Figure 5:
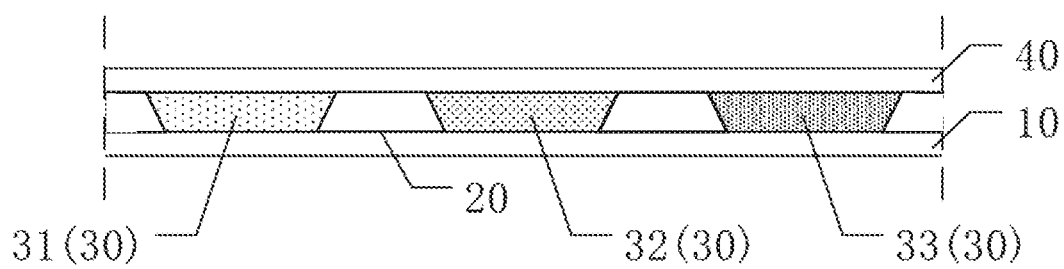
FIG. 5 is a schematic view showing a layered structure in step S40 according to an embodiment of the present invention.

Step S40, forming a transparent protective layer 40 on the black matrix 20 and the color pixel layer 30, as shown in FIG. 5, depositing a layer of transparent silicon oxide material on the black matrix 20 and a surface of the color pixel layer 30 away from the substrate 10 to form the transparent protective layer 40.

Figure 6:
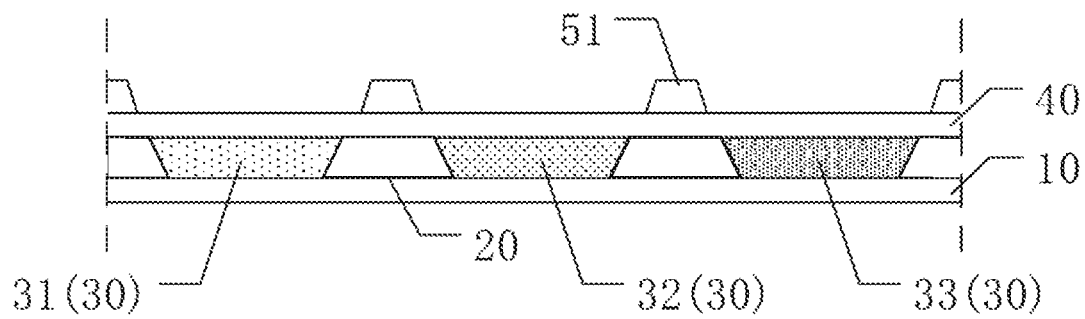
FIG. 6 is a schematic view showing a layered structure in step S51 according to an embodiment of the present invention.
Figure 7:
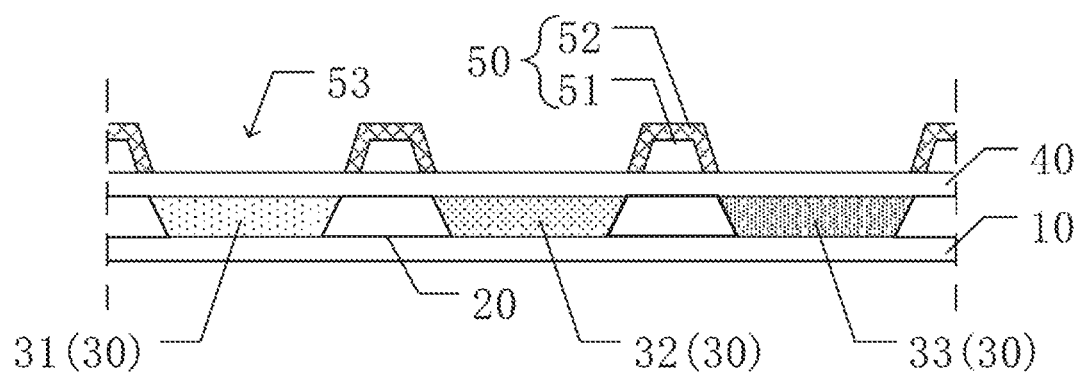
FIG. 7 is a schematic view showing a layered structure in step S52 according to an embodiment of the present invention.

Step S50, forming a pixel definition layer 50 on the transparent protective layer 40, including:

step S51, forming a first pixel-defining structure 51, as shown in FIG. 6, depositing an organic material layer or an inorganic material layer on a surface of the transparent protective layer 40 away from the black matrix 20 and the color pixel layer 30 by chemical vapor deposition. Then, patterning the organic material layer or the inorganic material layer to form the first pixel-defining structure 51; and step S52, forming a second pixel-defining structure 52, as shown in FIG. 7, depositing a layer of black hydrophobic material on the transparent protective layer 40 and the first pixel-defining structure 51, and then patterning the layer of black hydrophobic material to form a plurality of second openings 53 in the layer of hydrophobic material while forming the second pixel-defining structure 52, and the second pixel-defining structure 52 encapsulates the first pixel-defining structure 51.

The first pixel-defining structure 51 and the second pixel-defining structure 52 are combined to form the pixel definition layer 50.

Step S60, forming a quantum dot light-conversion layer 60 on the transparent protective layer 40. Printing a red quantum dot material by inkjet printing in the second openings 53 corresponding to the red sub-pixels 31, a green quantum dot material is also printed by the inkjet printing method in the second openings 53 corresponding to the green sub-pixels 32. Then, the red quantum dot material and the green quantum dot material are thermally cured to form the quantum dot light-conversion layer 60, and finally the color filter substrate 100 as shown in FIG. 1 is formed.

In the embodiment of the present invention, the color filter substrate 100 is provided. The pixel definition layer 50 in the color filter substrate 100 has a two-layer structure, of which the first pixel-defining structure 51 is made of silicon oxide, silicon nitride, or organic material. Due to its material properties, the pixel defining layer 50 is provided with better structural support strength, the pixel defining layer 50 reaches the target height, and the undercut phenomenon is less likely to occur. The second pixel-defining structure 52 is made of a light-shielding hydrophobic material, which ensures shading property of the pixel definition layer 50. The color filter substrate 100 in the embodiments of the invention can improve the stability of the quantum dot light-conversion layer 60, improve the blue light-conversion rate of the blue light organic light-emitting diodes (OLEDs), thereby improving the yield of the products. Moreover, the fabricating method is simple, and the fabricating materials can also be purchased on the market.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A color filter substrate, comprising:
   a pixel definition layer comprising a first pixel-defining structure and a second pixel-defining structure, wherein the second pixel-defining structure encapsulates the first pixel-defining structure, and a material used for the second pixel-defining structure is a light-shielding hydrophobic material;
   a substrate;
   a black matrix disposed on the substrate, wherein a plurality of first openings are provided in the black matrix;
   a color pixel layer disposed on the substrate and disposed in the plurality of first openings; and
   a transparent protective layer covering a surface of the color pixel layer away from the substrate and covering a surface of the black matrix away from the substrate;
   wherein a plurality of second openings are disposed in the pixel definition layer, the color filter substrate further comprises a quantum dot light-conversion layer disposed on the transparent protective layer in the second openings, and the second pixel-defining structure covers a surface of the first pixel-defining structure adjacent to the quantum dot light-conversion layer.

2. The color filter substrate according to claim 1, wherein the pixel definition layer is disposed on a surface of the transparent protective layer away from the color pixel layer, and the pixel definition layer corresponds to the black matrix.

3. The color filter substrate according to claim 1, wherein the color pixel layer comprises a plurality of red sub-pixels, green sub-pixels, and blue sub-pixels, and the red sub-pixels, the green sub-pixels, and the blue sub-pixels are all evenly distributed on the substrate and filled in the first openings.

4. The color filter substrate according to claim 3, wherein the second openings are positioned corresponding to the first openings.

5. The color filter substrate according to claim 4, wherein the quantum dot light-conversion layer is provided in the second openings corresponding to the red sub-pixels and the green sub-pixels.

6. The color filter substrate according to claim 1, wherein a material used for the first pixel-defining structure comprises one or more of silicon oxide, silicon nitride, and an organic material.

7. The color filter substrate according to claim 1, wherein a cross-sectional shape of the pixel definition layer and a cross-sectional shape of the first pixel-defining structure are both trapezoidal.

8. The color filter substrate according to claim 1, wherein a height of the pixel definition layer is greater than 6 um.

9. A method of fabricating a color filter substrate, comprising steps of:
- providing a substrate;
- forming a black matrix on the substrate;
- forming a color pixel layer on the substrate;
- forming a transparent protective layer on the black matrix and the color pixel layer, wherein the transparent protective layer covers a surface of the color pixel layer away from the substrate and covers a surface of the black matrix away from the substrate;
- forming a first pixel-defining structure on the substrate;
- forming a second pixel-defining structure on the first pixel-defining structure, wherein a material used for the second pixel-defining structure is a light-shielding hydrophobic material; and
- forming a quantum dot light-conversion layer on the transparent protective layer, wherein the second pixel-defining structure covers a surface of the first pixel-defining structure adjacent to the quantum dot light-conversion layer.

* * * * *